(12) United States Patent
Sung

(10) Patent No.: US 11,232,826 B2
(45) Date of Patent: Jan. 25, 2022

(54) SEMICONDUCTOR DEVICE AND SEMICONDUCTOR MEMORY APPARATUS INCLUDING THE SEMICONDUCTOR DEVICE

(71) Applicant: SK hynix Inc., Icheon-si (KR)

(72) Inventor: Ki Hyuk Sung, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/723,800

(22) Filed: Dec. 20, 2019

(65) Prior Publication Data

US 2020/0357458 A1 Nov. 12, 2020

(30) Foreign Application Priority Data

May 10, 2019 (KR) .......... 10-2019-0054903

(51) Int. Cl.
*G11C 11/4074* (2006.01)
*G11C 7/14* (2006.01)
*G11C 29/00* (2006.01)
*G11C 11/4099* (2006.01)

(52) U.S. Cl.
CPC ........... *G11C 11/4074* (2013.01); *G11C 7/14* (2013.01); *G11C 11/4099* (2013.01); *G11C 29/787* (2013.01); *G11C 29/83* (2013.01); *G11C 29/832* (2013.01)

(58) Field of Classification Search
CPC ..... G11C 29/83; G11C 29/832; G11C 29/787; G11C 17/14; G11C 17/16; G11C 17/165; G11C 11/4074; G11C 11/4099; G11C 7/14

USPC .............................................. 365/225.7, 228
See application file for complete search history.

(56) References Cited

U.S. PATENT DOCUMENTS

| | | | | |
|---|---|---|---|---|
| 5,768,290 A * | 6/1998 | Akamatsu | ............... | G11C 29/02 714/732 |
| 6,246,627 B1 * | 6/2001 | Yamauchi | .......... | G01R 31/3004 365/229 |
| 6,333,876 B1 * | 12/2001 | Kawasaki | ............ | G11C 29/802 365/200 |
| 6,346,738 B1 * | 2/2002 | Kim | ....................... | G11C 17/16 257/529 |
| 6,392,938 B1 * | 5/2002 | Choi | .................... | G11C 29/785 365/200 |
| 6,914,842 B2 * | 7/2005 | Huang | ................... | G11C 16/10 365/185.14 |
| 6,967,881 B2 * | 11/2005 | Sasaki | .................... | G11C 29/02 257/E27.103 |
| 7,085,179 B2 * | 8/2006 | Park | ..................... | G11C 29/789 257/E21.694 |
| 7,154,791 B2 * | 12/2006 | Kim | ..................... | G11C 29/812 365/200 |

(Continued)

FOREIGN PATENT DOCUMENTS

KR 1020060097521 A 9/2006
KR 1020160147423 A 12/2016

*Primary Examiner* — Son L Mai
(74) *Attorney, Agent, or Firm* — William Park & Associates Ltd.

(57) ABSTRACT

A semiconductor device may include a main circuit component and a spare circuit component including a plurality of spare elements and selected to change a function of the main circuit component, wherein each of the plurality of spare elements is configured to block a source voltage supply.

12 Claims, 11 Drawing Sheets

(56) References Cited

U.S. PATENT DOCUMENTS

| | | | |
|---|---|---|---|
| 7,505,350 B2* | 3/2009 | Lee | G11C 5/147 |
| | | | 365/225.7 |
| 8,477,553 B2* | 7/2013 | Kang | G11C 29/781 |
| | | | 365/226 |

* cited by examiner

INV

NOR

SEMICONDUCTOR DEVICE AND SEMICONDUCTOR MEMORY APPARATUS INCLUDING THE SEMICONDUCTOR DEVICE

CROSS-REFERENCES TO RELATED APPLICATION

The present application claims priority under 35 U.S.C. § 119(a) to Korean application number 10-2019-0054903, filed on May 10, 2019, in the Korean Intellectual Property Office, which is incorporated herein by reference in its entirety.

BACKGROUND

1. Technical Field

Various embodiments generally relate to a semiconductor integrated apparatus, and more particularly, to a semiconductor device and a semiconductor memory apparatus including the semiconductor device.

2. Related Art

A semiconductor integrated circuit may be configured with a plurality of layers.

If a function of a semiconductor integrated circuit is to be changed after the semiconductor integrated circuit is designed, spare logic may be prepared in order to prevent a revision from the lowest layer.

Accordingly, the function of the integrated circuit can be changed through the revision to an upper layer without the revision to all layers.

If the spare logic is not operated, however, an unnecessary current may be consumed by a leakage current.

SUMMARY

In an embodiment, a semiconductor device may include a main circuit component and a spare circuit component. The spare circuit component may include a plurality of spare elements and selected to change a function of the main circuit component, wherein each of the plurality of spare elements may be configured to block a source voltage supply.

In an embodiment, a semiconductor memory apparatus may include a main circuit component including a core circuit component. The semiconductor memory apparatus may include a spare circuit component including a plurality of spare elements and the spare circuit component selected to change a function of the main circuit component, wherein each of the plurality of spare elements may be configured to block a source voltage supply.

In an embodiment, a spare element may include a first line provided with a cutoff part; a second line; and a logic circuit component formed between the first line and the second line. The first line may be separated from a source voltage supply terminal by the cutoff part.

DETAILED DESCRIPTION

Hereinafter, a semiconductor device and a semiconductor memory apparatus will be described below with reference to the accompanying drawings through various examples of embodiments.

Figure 1:
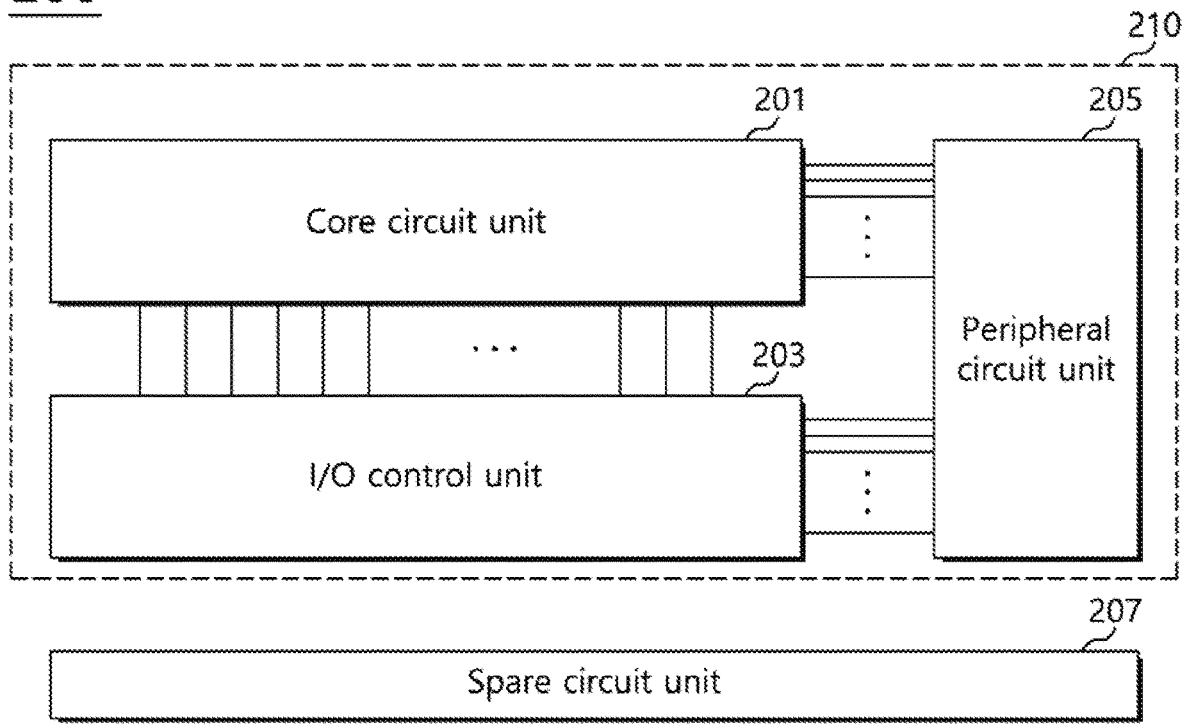
FIG. 1 illustrates a configuration of a semiconductor device according to an embodiment.

FIG. 1 illustrates a configuration of a semiconductor device 200 according to an embodiment.

Referring to FIG. 1, the semiconductor device 200 according to the embodiment may include a core circuit component 201, an input/output (I/O) control unit 203, a peripheral circuit component 205 and a spare circuit component 207.

The core circuit component 201 may include major peripheral circuit components related to an operation of the semiconductor device 200. If the semiconductor device 200 is a memory device, a plurality of memory cells may be included in the core circuit component 201.

The I/O control unit 203 may receive data read by the core circuit component 201 and output the data to the peripheral circuit component 205 or may write data, provided by the peripheral circuit component 205, in the core circuit component 201.

The peripheral circuit component 205 may include a buffer for the I/O of data and an address, a decoder and other control circuits.

The core circuit component 201, the I/O control unit 203 and the peripheral circuit component 205 may be called a main circuit component 210.

The spare circuit component 207 may include a plurality of spare elements having various forms, and may be a set of spare elements used to change a function of the main circuit component 210 based on the results of a revision after the semiconductor device 200 is fabricated.

In an embodiment, to change a function of the main circuit component 210 may include adding a logic circuit, adjusting the delay time of a signal or changing a voltage level.

After the semiconductor device 200 is fabricated, a function of the main circuit component 210 including the core circuit component 201, the I/O control unit 203 and the peripheral circuit component 205 may be changed based on the results of a revision using a spare element within the spare circuit component 207.

The plurality of spare elements included in the spare circuit component 207 may not perform any operation if they are not used to change a function of the main circuit component 210. Accordingly, a leakage current occurs in the state in which the spare elements have been electrically coupled to a source voltage supply stage.

As the capacity of the semiconductor device 200 increases and the semiconductor devices are highly-integrated, the number of spare elements included in the spare circuit component 207 may also increase, and a total amount of a leakage current that occurs in the spare elements may increase to a considerable level.

In an embodiment of this technology, in each of the spare elements included in the spare circuit component 207, a source voltage supply terminal (or power line) may be formed to be disconnected from the source voltage supply stage without being electrically coupled to the source voltage supply stage.

That is, by disconnecting the spare element from the source voltage supply stage without being electrically coupled to the source voltage supply stage, a leakage current that may occur in the spare element can be fundamentally blocked.

It is evident that the power line of a spare element determined to be used to change a function of the main circuit component 210 based on the results of a revision is electrically coupled to the power supply stage and thus the spare element performs a normality operation.

Figure 2:
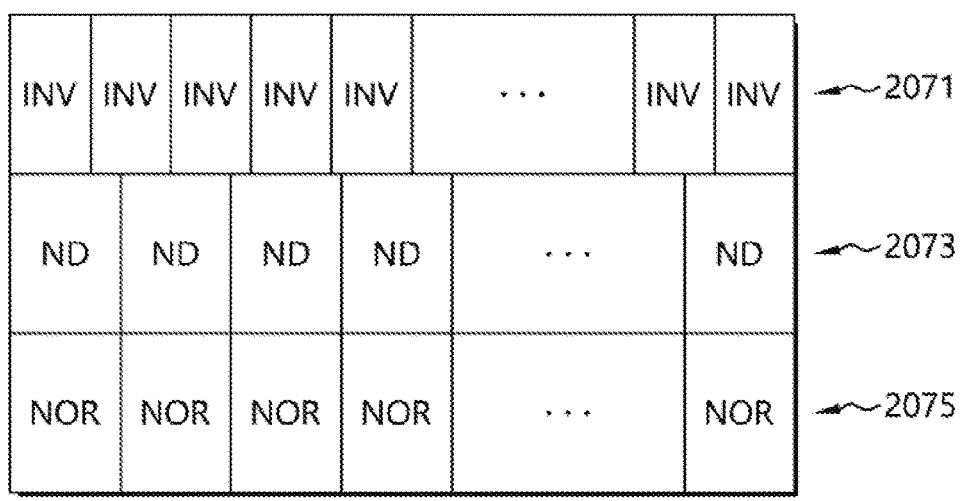
FIG. 2 illustrates a configuration of a spare circuit component according to an embodiment.

FIG. 2 illustrates a configuration of a spare circuit component according to an embodiment.

Referring to FIG. 2, the spare circuit component 207 may include an inverter circuit component 2071, a NAND gate circuit component 2073 and a NOR gate circuit component 2075.

The inverter circuit component 2071 may include a plurality of inverter circuits INV. The NAND gate circuit component 2073 may include a plurality of NAND gate circuits ND. The NOR gate circuit component 2075 may include a plurality of NOR gate circuits NOR.

The inverter circuits, the NAND gate circuits, and the NOR gate circuits may be configured with MOS transistors, preferably CMOS circuits.

In this technology, the power line of a transistor included in each of the spare elements included in the spare circuit component 207 may be configured to be disconnected from a source voltage supply terminal. Accordingly, a leakage current never occurs because a power supply to the spare element is blocked.

Figure 3:
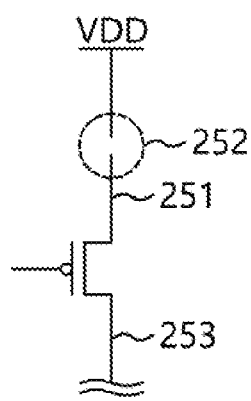
FIGS. 3 and 4 illustrate configurations of spare elements according to an embodiment.
Figure 4:
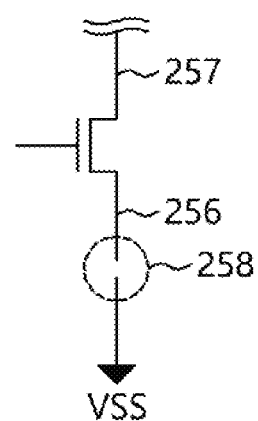

FIGS. 3 and 4 illustrate configurations of spare elements according to an embodiment.

Referring to FIG. 3, a PMOS transistor 250 is illustrated as an example of the spare element.

The PMOS transistor 250 according to an embodiment of this technology may have a source terminal electrically coupled to a first line 251 and have a drain terminal electrically coupled to a second line 253. In the case of a known PMOS transistor, the first line 251, that is, a power line, is electrically coupled to a source voltage supply terminal VDD. In contrast, in the PMOS transistor 250 according to this technology, a cutoff part 252 is formed in the first line 251, and thus the source voltage supply terminal VDD and the PMOS transistor 250 can be electrically blocked.

Referring to FIG. 4, an NMOS transistor 250-1 is illustrated as an example of the spare element.

The NMOS transistor 250-1 according to an embodiment of this technology may have a source terminal electrically coupled to a first line 256 and have a drain terminal electrically coupled to a second line 257. In the case of a known NMOS transistor, the first line 256, that is, a power line, is electrically coupled to a ground voltage supply terminal VSS. In contrast, in the NMOS transistor 250-1 according to this technology, a cutoff part 258 is formed in the first line 256, and thus the ground voltage supply terminal VSS and the NMOS transistor 250-1 can be electrically separated.

Figure 5:
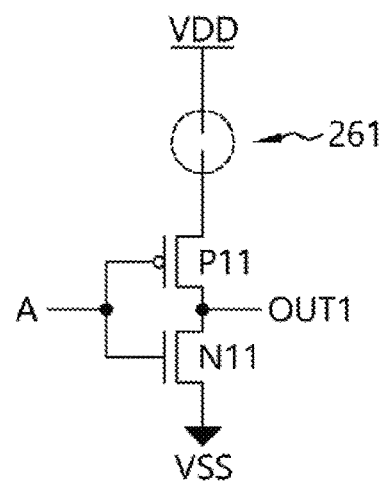
FIGS. 5, 6A, and 6B illustrate a circuit and layout diagram of a spare element according to an embodiment.

FIGS. 5 and 6 illustrate a circuit and layout diagram of a spare element according to an embodiment.

FIG. 5 is a circuit diagram of an inverter circuit INV which may be included in the spare circuit component 207. As illustrated in FIG. 5, the inverter circuit INV used as a spare element may include a PMOS transistor P11, that is, a first transistor having an input signal A applied to a gate terminal thereof and electrically coupled between a source terminal thereof and an output terminal OUT1 and an NMOS transistor N11, that is, a second transistor having the input signal A applied to a gate terminal thereof and electrically coupled between the output terminal OUT1 and a ground terminal VSS. Furthermore, a cutoff part 261 is formed between a source voltage supply terminal VDD and a power line, that is, the source terminal, and thus the supply of the power supply voltage can be blocked.

Figure 6A:
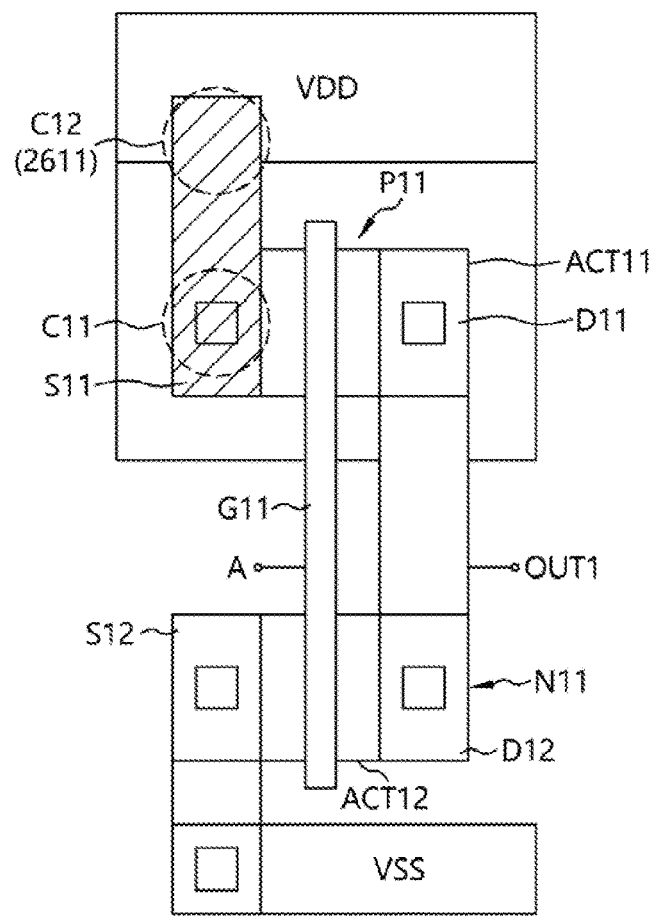
Figure 6B:
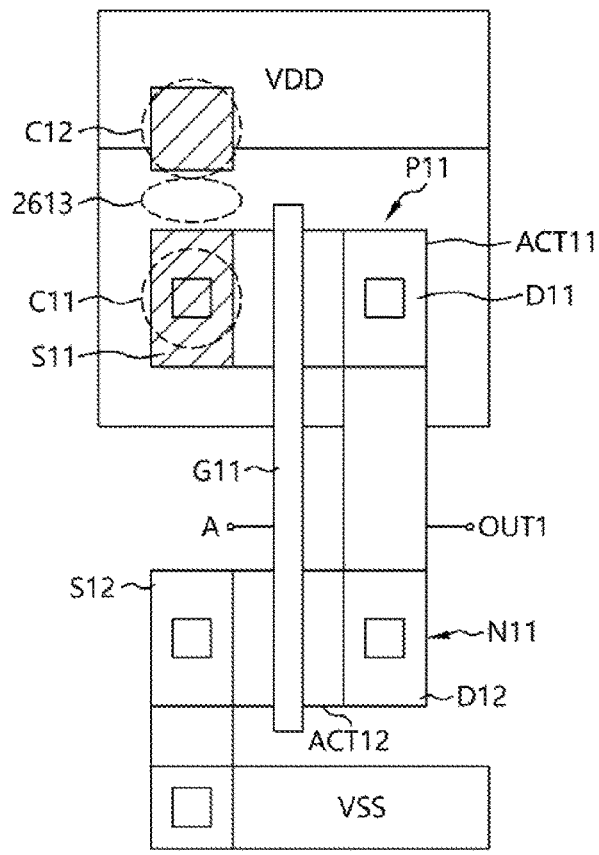

FIG. 6A and FIG. 6B are a layout diagram of the inverter circuit INV illustrated in FIG. 5.

Referring to FIGS. 6A and 6B, the inverter circuit INV according to an embodiment may include a first transistor P11, that is, a PMOS transistor, including a gate line G11 traversing a first active area ACT11 formed on a semiconductor substrate and having an input signal A applied thereto, a first source line S11 formed on one side of the gate line G11 and electrically coupled to a source contact C11, and a first drain line D11 formed on the other side of the gate line G11 and having an output signal OUT1 applied thereto.

Furthermore, the inverter circuit INV may include a second transistor N11, that is, an NMOS transistor, including the gate line G11, a second source line S12 formed in a second active area ACT12 on one side of the gate line G11 and having a ground line VSS electrically coupled thereto, and a second drain line D12 formed in the second active area ACT12 on the other side of the gate line G11 and electrically coupled to the first drain line D11.

The inverter circuit INV of this technology may be formed so that the first source line S11 is electrically blocked from a source voltage supply terminal VDD.

In one embodiment, as in FIG. 6A, the first source line S11 electrically coupled to the source contact C11 may be laid out to have an intersection 2611 that intersects the source voltage supply terminal VDD without a contact with the source voltage supply terminal VDD. The intersection 2611 may act as a cutoff part between the source line S11 and the source voltage supply terminal VDD. To this end, when the inverter circuit INV is laid out, a metal contact C12 for electrically coupling the source line S11 and the source voltage supply terminal VDD may be omitted.

In an embodiment, as in FIG. 6B, the first source line S11 may include a cutoff part 2613 between one side electrically coupled to the source contact C11 and the other side coupled to the source voltage supply terminal VDD through the metal contact C12. The cutoff part 2613 may generated by omitting a wiring process.

Figure 7:
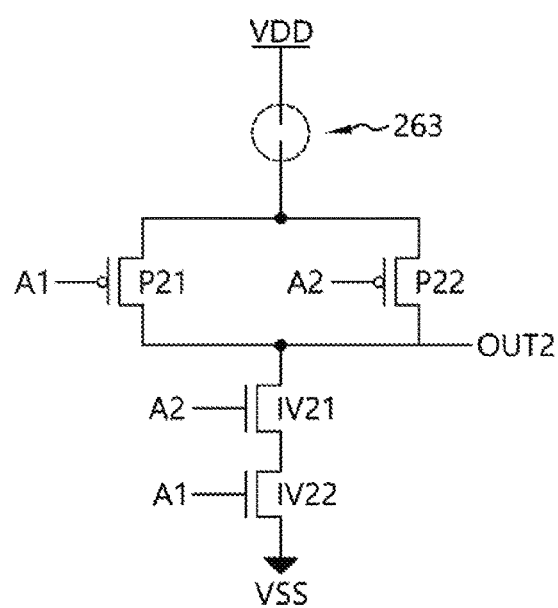
FIGS. 7, 8A, and 8B illustrate a circuit and layout diagram of a spare element according to an embodiment.

FIGS. 7 and 8 illustrate a circuit and layout diagram of a spare element according to an embodiment.

FIG. 7 is a diagram of an NAND gate circuit ND which may be included in the spare circuit component 207. As illustrated in FIG. 7, the NAND gate circuit ND used as a spare element may be electrically separated from the power supply voltage terminal VDD because a cutoff part 263 is formed in a line to which the power supply voltage VDD is supplied.

Specifically, the NAND gate circuit ND may include a first PMOS transistor P21, that is, a first transistor, having a first input signal A1 applied to a gate terminal thereof and electrically coupled between a source terminal thereof and an output terminal OUT2, a second PMOS transistor P22, that is, a second transistor, having a second input signal A2 applied to its gate terminal and electrically coupled between a source terminal thereof and the output terminal OUT2, and a first NMOS transistor N21, that is, a third transistor, and a second NMOS transistor N22, that is, a fourth transistor, electrically coupled in series between the output terminal OUT2 and a ground terminal VSS and having the second input signal A2 and the first input signal A1 applied to their gate terminals, respectively.

The source terminals of the first and second PMOS transistors P21 and P22 and the source voltage supply terminal VDD may be electrically blocked by the cutoff part 263.

Figure 8A:
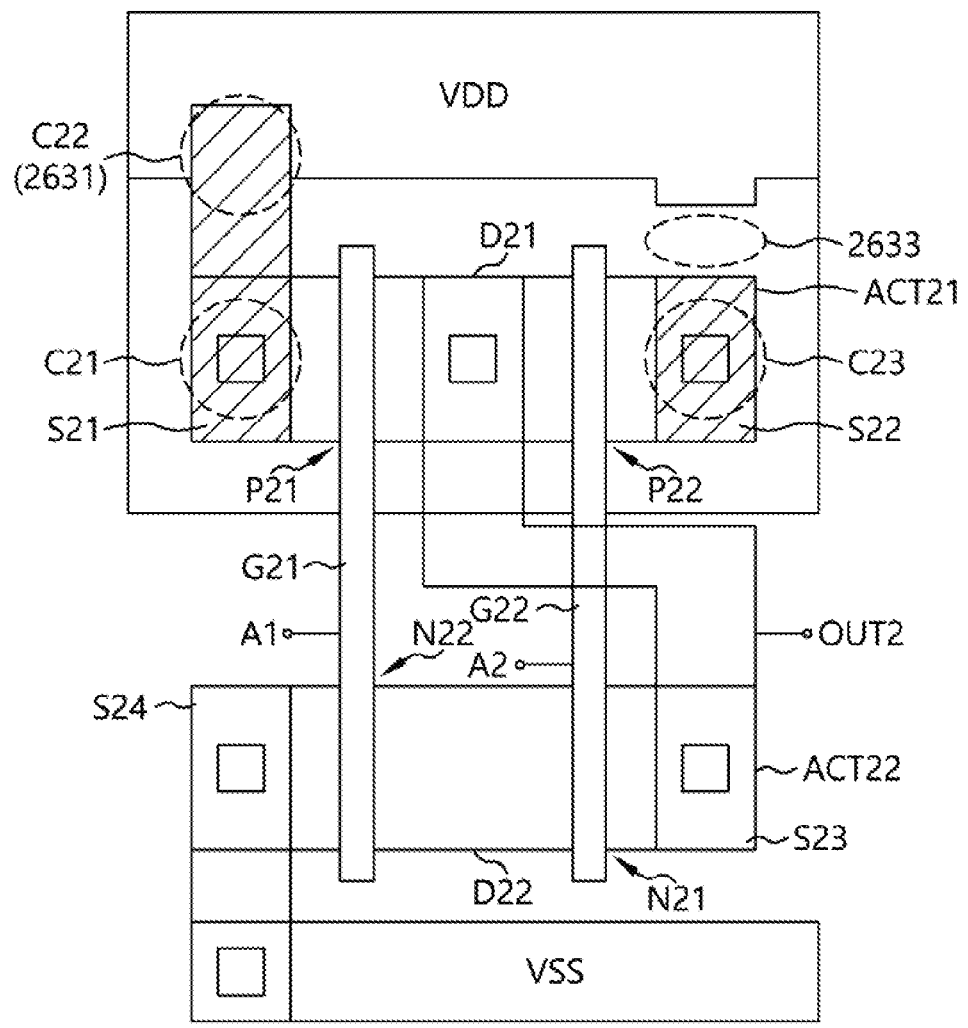
Figure 8B:
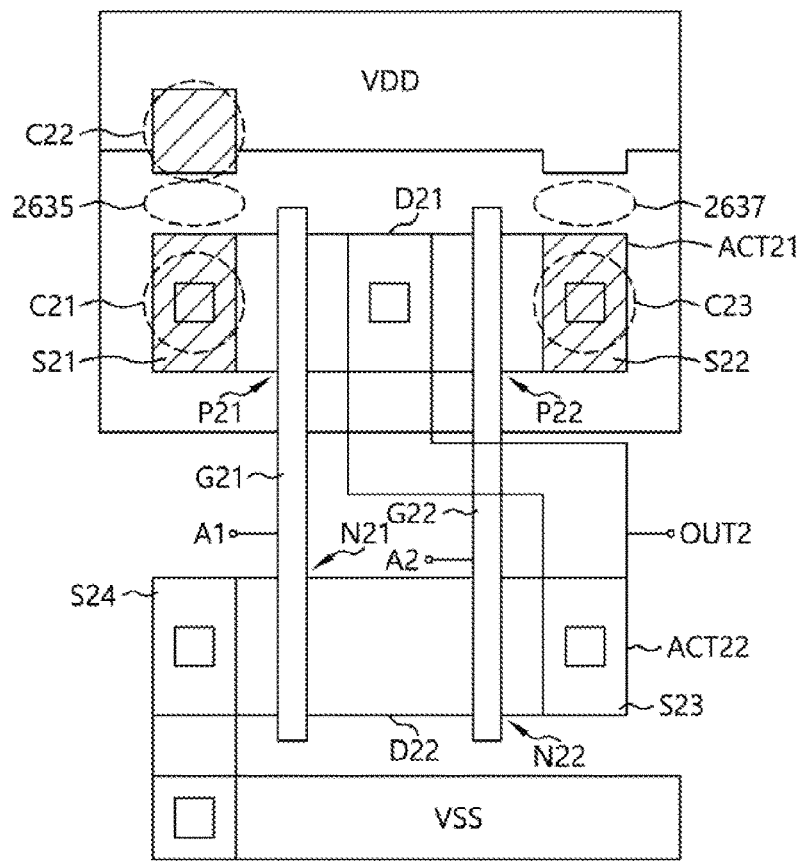

FIGS. 8A and 8B are a layout diagram of the NAND gate circuit ND illustrated in FIG. 7.

Referring to FIGS. 8A and 8B, the NAND gate circuit ND according to an embodiment may include a first transistor P21, that is, a PMOS transistor, including a first gate line G21 traversing a first active area ACT21 and having a first input signal A1 applied thereto, a first source line S21 formed in the first active area ATC21 on one side of the first gate line G21 and electrically coupled to a source contact C21, and a first drain line D21 formed on the other side of the first gate line G21 and having an output signal OUT2 applied thereto.

Furthermore, the NAND gate circuit ND may include a second transistor P22, that is, a PMOS transistor, including a second gate line G22 spaced apart from the first gate line G21 in such a way not to intersect with the first gate line G21 and traversing the first active area ACT21 and have a second input signal A2 applied thereto, a first drain line D21 formed on one side of the second gate line G22, and a second source line S22 formed in the first active area ACT21 on the other side of the second gate line G22 and electrically coupled to a source contact C23.

The NAND gate circuit ND may include a third transistor N21, that is, an NMOS transistor, including the second gate line G22, a second drain line D22 formed in the second active area ACT22 on one side of the second gate line G22, and a third source line S23 formed in a second active area ACT22 on the other side of the second gate line G22 and electrically coupled to the first drain line D21.

The NAND gate circuit ND may include a fourth transistor N22, that is, an NMOS transistor, including the first gate line G21, a fourth source line S24 formed in the second active area ACT22 on one side of the first gate line G21 and electrically coupled to a ground terminal VSS, and the second drain line D22 formed in the second active area ACT22 on the other side of the first gate line G21.

The first and second source lines S21 and S22 of the first and second transistors P21 and P22 included in the NAND gate circuit ND may be electrically blocked from the source voltage supply terminal VDD.

In one embodiment, as in FIG. 8A, the first source line S21 electrically coupled to the source contact C21 may be laid out to have an intersection 2631 that intersects with a source voltage supply terminal VDD without a contact with the source voltage supply terminal VDD. The intersection 2631 may act as a cutoff part between the first source line S21 and the source voltage supply terminal VDD. To this end, when the NAND gate circuit ND is laid out, a metal contact C22 for electrically coupling the first source line S21 and the source voltage supply terminal VDD may be omitted.

Furthermore, the second source line S22 may include a cutoff part 2633 having one side electrically coupled to the source contact C23 and the other side separated from the source voltage supply terminal VDD.

In one embodiment, as in FIG. 8B, the first source line S21 may include a cutoff part 2635 between one side electrically coupled to the source contact C21 and the other side electrically coupled to the source voltage supply terminal VDD. The second source line S22 may include a cutoff part 2637 having one side electrically coupled to a source contact C23 and the other side separated from the source voltage supply terminal VDD.

Figure 9:
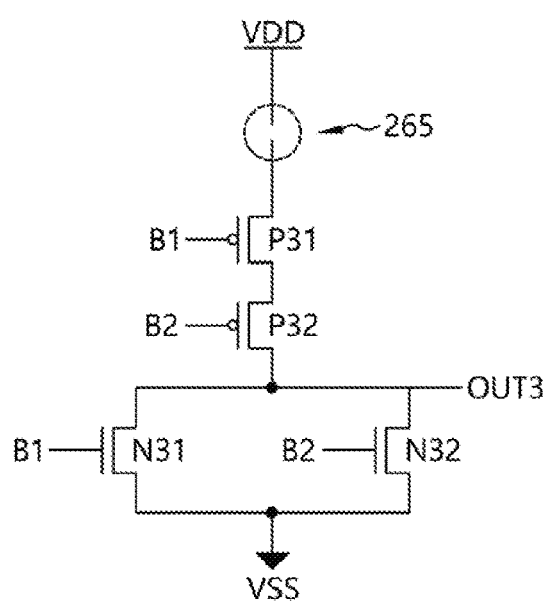
FIGS. 9, 10A, and 10B illustrate a circuit and layout diagram of a spare element according to an embodiment.

FIGS. 9 and 10 illustrate a circuit and layout diagram of a spare element according to an embodiment.

FIG. 9 is a diagram of an NOR gate circuit NOR which may be included in the spare circuit component 207. As illustrated in FIG. 9, the NOR gate circuit NOR used as a spare element may be electrically separated from the power supply voltage terminal VDD because a cutoff part 265 is formed in a line to which a power supply voltage VDD is supplied.

Specifically, the NOR gate circuit NOR may include a first PMOS transistor P31, that is, a first transistor, and a second PMOS transistor P32, that is, a the second transistor, electrically coupled in series between source terminals thereof and an output terminal OUT3 and having a first input signal B1 and a second input signal B2 applied to gate terminals thereof, respectively, a first NMOS transistor N31, that is, a third transistor having the first input signal B1 applied to a gate terminal thereof and electrically coupled between the output terminal OUT3 and a ground terminal VSS, and a second NMOS transistor N32, that is, a fourth transistor having the second input signal B2 applied to a gate terminal thereof and electrically coupled between the output terminal OUT3 and the ground terminal VSS.

The source terminal of the first PMOS transistor P31 and the source voltage supply terminal VDD may be electrically blocked by the cutoff part 265.

Figure 10A:
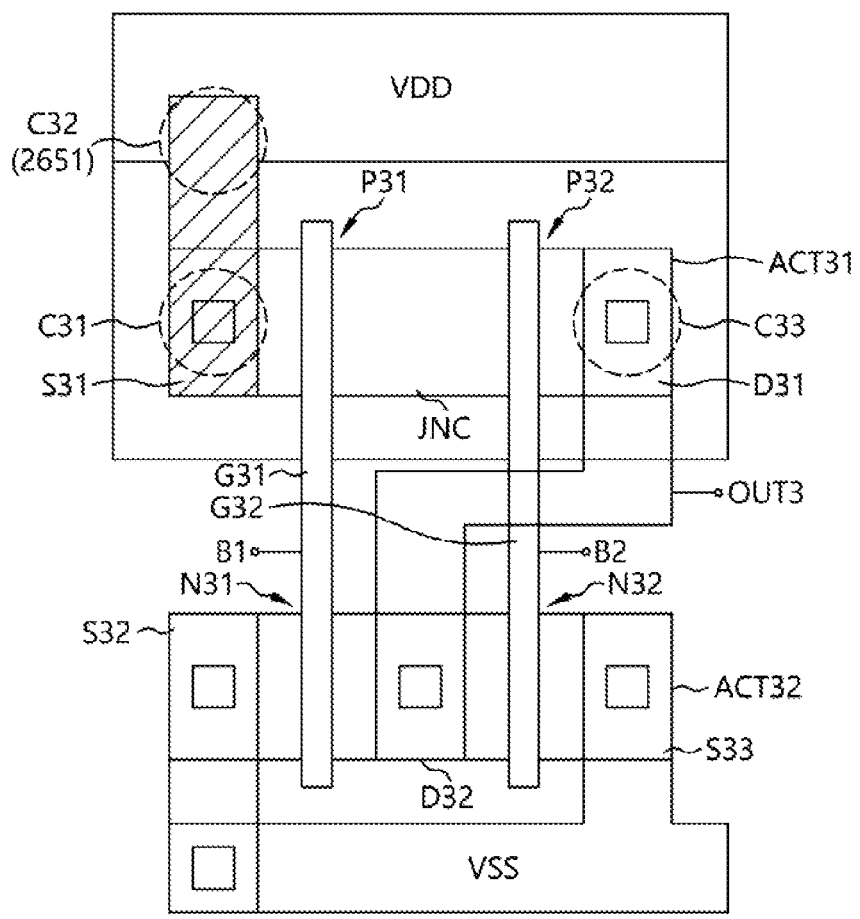
Figure 10B:
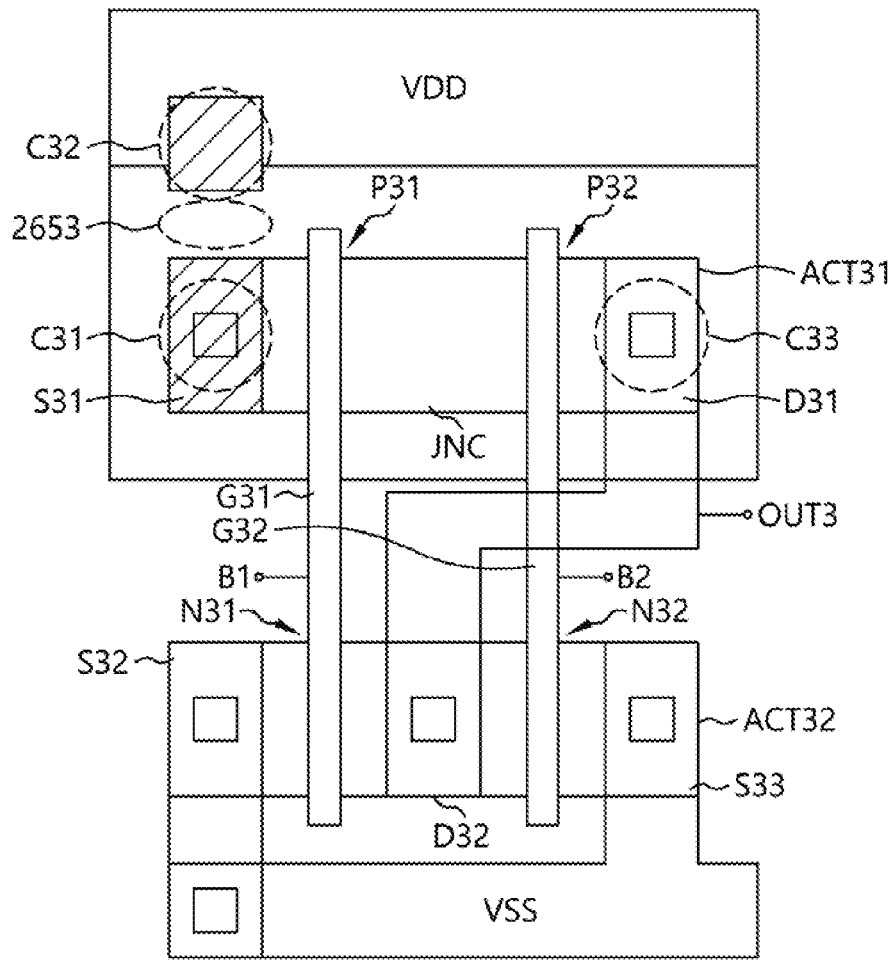

FIGS. 10A and 10B are a layout diagram of the NOR gate circuit NOR illustrated in FIG. 9.

Referring to FIGS. 10(a) and 10(b), the NOR gate circuit NOR according to an embodiment may include a first transistor P31, that is, a PMOS transistor, including a first gate line G31 traversing a first active area ACT31 and having a first input signal B1 applied thereto, a first source line S31 formed in the first active area ATC31 on one side of the first gate line G31 and electrically coupled to a source contact C31, and a junction JNC formed on the other side of the first gate line G31.

Furthermore, the NOR gate circuit NOR may include a second transistor P32, that is, a PMOS transistor, including a second gate line G32 spaced apart from the first gate line G31 in such a way not to intersect with the first gate line G31, traversing the first active area ACT31 and having a second input signal B2 applied thereto, the junction JNC formed on one side of the second gate line G32, and a first drain line D31 formed in the first active area ACT31 on the other side of the second gate line G32 and electrically coupled to a drain contact C33.

The NOR gate circuit NOR may include a third transistor N31, that is, an NMOS transistor, including the first gate line G31 and an second source line S32 formed in a second active area ACT32 on one side of the first gate line G31 and electrically coupled to a ground terminal VSS.

The NOR gate circuit NOR may include a fourth transistor N32, that is, an NMOS transistor, including the fourth gate line G32, a second drain line D32 formed in the second active area ACT32 on one side of the second gate line G32 and electrically coupled to the first drain line D31, and a third source line S33 formed in the second active area ACT32 on the other side of the second gate line G32 and electrically coupled to the ground terminal VSS.

The first source line S31 of the first transistor P21 included in the NOR gate circuit NOR may be electrically blocked from the source voltage supply terminal VDD.

In one embodiment, as in FIG. 10A, the first source line S31 electrically coupled to the source contact C31 may be laid out to have an intersection 2651 that intersects with the source voltage supply terminal VDD without a contact with the source voltage supply terminal VDD. The intersection 2651 may act as a cutoff part between the first source line S31 and the source voltage supply terminal VDD. To this end, when the NOR gate circuit NOR is laid out, a metal contact C32 for electrically coupling the first source line S31 and the source voltage supply terminal VDD may be omitted.

In one embodiment, as in FIG. 10B, the first source line S31 may include a cutoff part 2653 between one side electrically coupled to the source contact C31 and the other side electrically coupled to (the source voltage supply terminal VDD.

An electric current flowing through a spare element when the spare element is not used can be fundamentally blocked because a cutoff part capable of being separated from a source voltage supply terminal is configured when the spare element is laid out as described above. Furthermore, if a spare element is substituted with a main circuit based on the results of a revision, a normality operation can be performed by electrically coupling the power line of the spare element and a source voltage supply stage.

Figure 11:
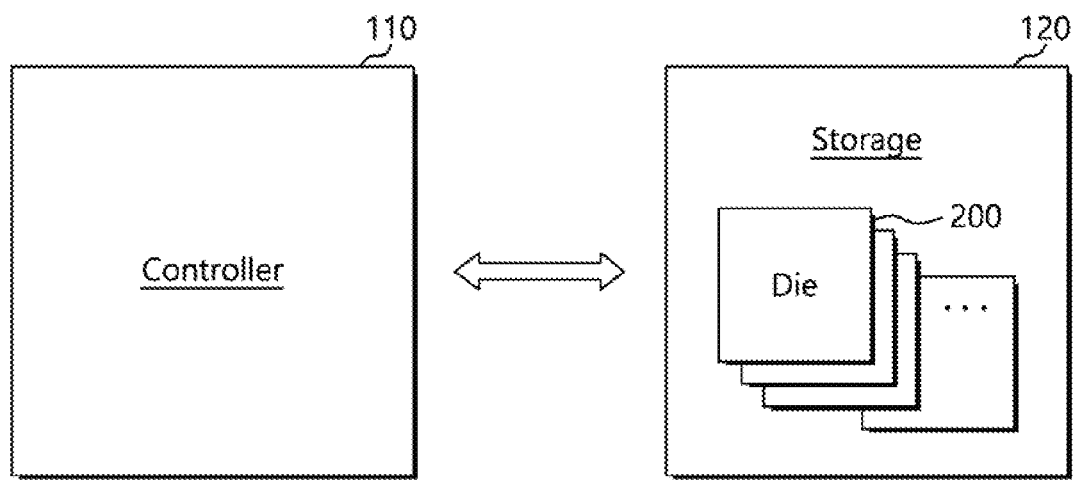
FIG. 11 illustrates a configuration of a data storage according to an embodiment.

FIG. 11 illustrates a configuration of a data storage according to an embodiment.

Referring to FIG. 11, the data storage 10 according to an embodiment may include a controller 110 and a storage 120.

The controller 110 may control the storage 120 in response to a request from a host device. For example, the controller 110 may have data programmed in the storage 120 in response to a program (or write) request from the host device. Furthermore, the controller 110 may provide the host device with data written in the storage 120 in response to a read request from the host device.

The storage 120 includes a plurality of semiconductor devices 200, and may write data or output written data under the control of the controller 110. The storage 120 may be configured with a volatile or non-volatile memory device. In one embodiment, the storage 120 may be implemented using a memory element selected from various non-volatile memory elements, such as an electrically erasable and programmable ROM (EEPROM), a NAND flash memory, a NOR flash memory, a phase-change RAM (PRAM), a resistive RAM (ReRAM), a Ferroelectric RAM (FRAM), and a spin torque transfer magnetic RAM (STT-MRAM). The storage 120 may include a plurality of dies, a plurality of chips, or a plurality of packages. Furthermore, the storage 120 may be configured with a single-level cell in which data of one bit is stored in a single memory cell or a multi-level cell in which data plural bits is stored in a single memory cell.

A process of fabricating the storage 120 will be described in brief below.

First, a system to be fabricated is determined. A circuit that performs a related function of the determined system is schematically designed. Furthermore, a netlist of a gate level to represent connection information between a next cell or block whose designed circuit has been verified and a metal layer is configured. Furthermore, the layout data of an integrated circuit may be generated by disposing and routing standard cells to define the integrated circuit based on the netlist. The layout data may be data having a graphic design system (GDS) format.

Thereafter, layout-versus-schematic (LVS) result data may be generated by performing LVS verification on the integrated circuit. Furthermore, a parasitic component may be extracted from the layout data, the layout data may be modified based on the parasitic component, and a mask may be generated based on the modified layout data. Thereafter, a semiconductor integrated circuit may be fabricated by performing various semiconductor processes, including deposition, etching, ion, cleaning, and a patterning process using a mask, on the semiconductor substrate.

After the semiconductor integrated circuit is designed, a test may be performed. A metal revision may be performed based on a result of the test. In order to modify a semiconductor integrated circuit through a metal revision, GDS data may be generated and an extra semiconductor device, that is, a dummy gate or spare logic, may be then added.

If spare circuits have been added to the semiconductor integrated circuit, a metal circuit may be modified without modifying the mask when a metal revision is performed on a circuit design.

The spare logic may be a circuit to which a source voltage supply may be blocked when the spare logic is not used as in the spare element described with reference to FIGS. 2 to 10.

FIG. 11 illustrates an example of a non-volatile memory device used as a storage medium, but the spare circuit component 207 of this technology may be identically applied to a volatile memory device in addition to the non-volatile memory device.

Figure 12:
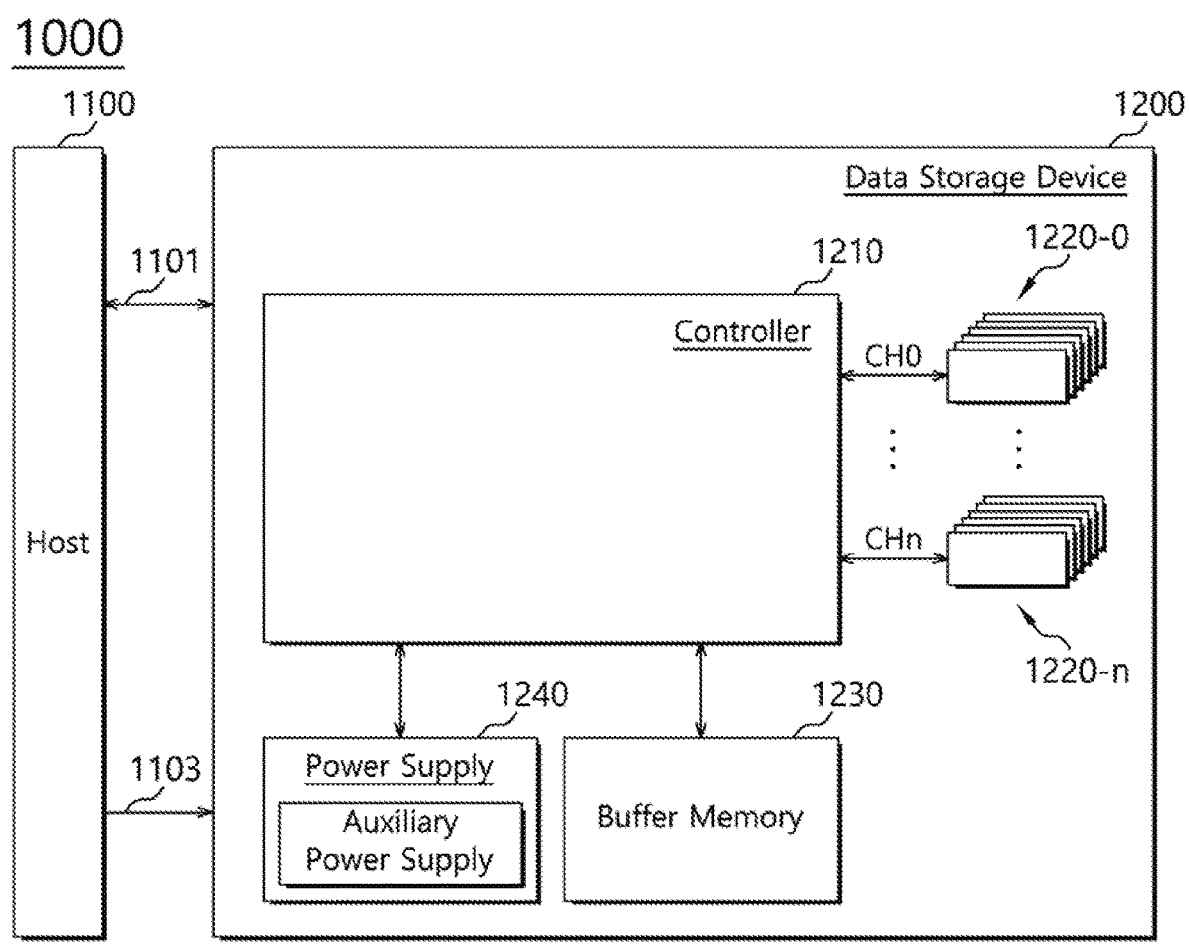
FIG. 12 is a diagram illustrating a data storage system in accordance with an embodiment.

FIG. 12 is a diagram illustrating a data storage system 1000, in accordance with an embodiment.

Referring to FIG. 12, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface unit, a control unit, a random access memory used as a working memory, an error correction code (ECC) unit, and a memory interface unit. In an embodiment, the controller 1210 may configured as controller 110 shown in FIGS. 1 and 2.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be normally terminated when a sudden power interruption occurs. The auxiliary power supply may include bulk-capacity capacitors sufficient to store the needed charge.

The signal connector 1101 may be configured as one or more of various types of connectors depending on an interface scheme between the host device 1100 and the data storage device 1200.

The power connector 1103 may be configured as one or more of various types of connectors depending on a power supply scheme of the host device 1100.

Figure 13:
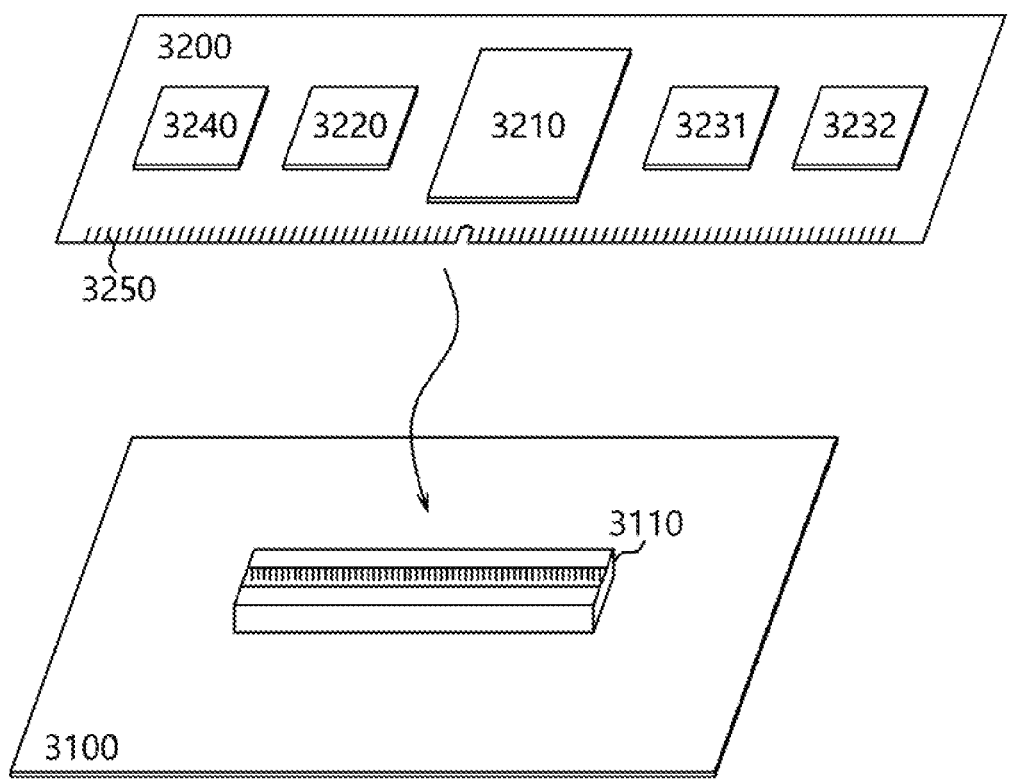
FIG. 13 and FIG. 14 are diagrams illustrating a data processing system in accordance with an embodiment.

FIG. 13 is a diagram illustrating a data processing system 3000, in accordance with an embodiment. Referring to FIG. 13, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200. The connection terminal 3250 may be configured as one or more of various types depending on an interface scheme between the host device 3100 and the memory system 3200. The connection terminal 3250 may be disposed on a side of the memory system 3200, as shown.

Figure 14:
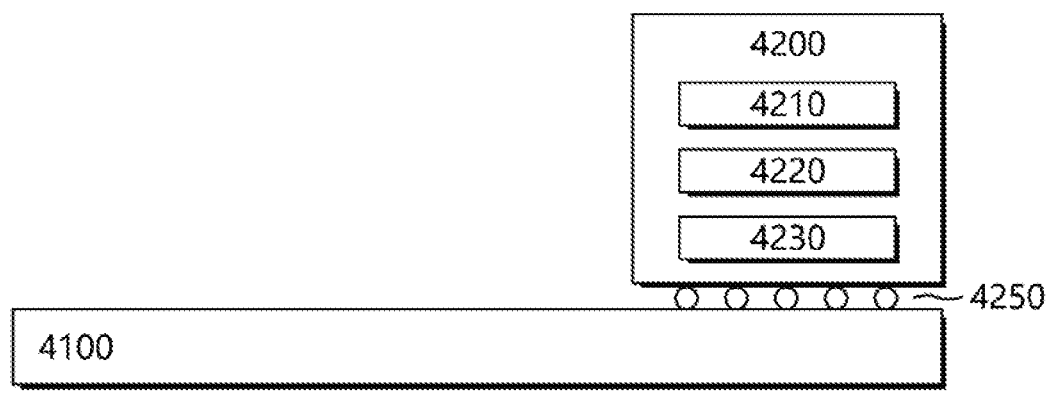

FIG. 14 is a diagram illustrating a data processing system 4000 in accordance with an embodiment. Referring to FIG. 14, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 shown in FIGS. 1 and 2.

The buffer memory device 4220 may temporarily store data be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 15:
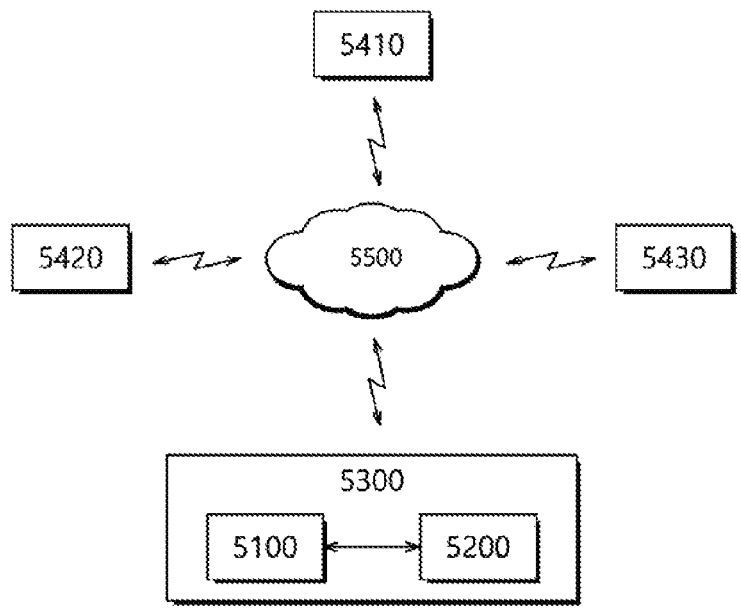
FIG. 15 is a diagram illustrating a network system including a data storage device in accordance with an embodiment.

FIG. 15 is a diagram illustrating a network system 5000 including a data storage device, in accordance with an embodiment. Referring to FIG. 15, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the memory system 10 shown in FIG. 1, the data storage device 1200 shown in FIG. 12, the memory system 3200 shown in FIG. 13, or the memory system 4200 shown in FIG. 14.

Figure 16:
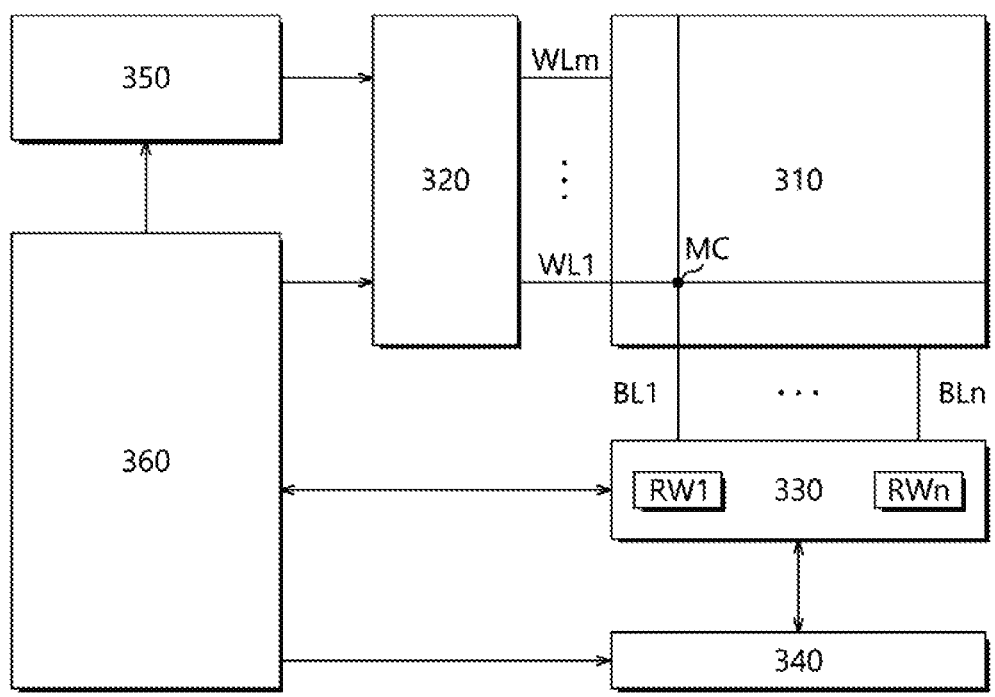
FIG. 16 is a block diagram illustrating a nonvolatile memory device included in a data storage device in accordance with an embodiment.

FIG. 16 is a block diagram illustrating a nonvolatile memory device 300 included in a data storage device, such as the data storage device 10, in accordance with an embodiment. Referring to FIG. 16, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure by perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided by the external device. For example, the control logic 360 may control operations of the nonvolatile memory device 300 such as read, write, and erase operations of the nonvolatile memory device 300.

While various embodiments have been described above, it will be understood to those skilled in the art that the embodiments described are by way of example only. Accordingly, the semiconductor device and semiconductor memory apparatus described herein should not be limited based on the described embodiments.

What is claimed is:

1. A semiconductor device comprising:
   a main circuit component; and
   a spare circuit component comprising a plurality of spare elements, and the spare circuit component electrically coupled to the main circuit component to change a function of the main circuit component, wherein each of the plurality of spare elements is configured to comprises a cutoff part to block a source voltage supply,
   wherein the cutoff part of a spare element electrically coupled to the main circuit component for a change in the function of the main circuit component is electrically coupled to a source voltage supply terminal, and
   wherein each of the spare elements comprises:
   at least one gate line traversing an active area formed on a semiconductor substrate;
   a source line formed on one side of each of the at least one gate line, and comprising the cutoff part;
   a drain line formed on the other side of each of the at least one gate line; and
   the cutoff part configured to electrically separate the source line and the source voltage supply terminal.

2. The semiconductor device according to claim 1, wherein each of the plurality of spare elements comprises the cutoff part in a source voltage supply terminal.

3. The semiconductor device according to claim 1, wherein the change in the function of the main circuit component comprises at least one of an addition of a logic circuit, an adjustment of a delay time of a signal, and a change in a voltage level.

4. The semiconductor device according to claim 1, wherein a spare element comprises:
   a first line provided with the cutoff part;
   a second line; and
   a logic circuit component formed between the first line and the second line,
   wherein the first line is separated from the source voltage supply terminal by the cutoff part.

5. The semiconductor device according to claim 1, wherein the cutoff part is provided between one side of the source line and the source voltage supply terminal.

6. A semiconductor memory apparatus comprising:
   a main circuit component comprising a core circuit component; and
   a spare circuit component comprising a plurality of spare elements, and the spare circuit component electrically coupled to the main circuit component to change a function of the main circuit component, wherein each of the plurality of spare elements is configured to comprises a cutoff part to block a source voltage supply,
   wherein the cutoff part of a spare element electrically coupled to the main circuit component for a change in the function of the main circuit component is electrically coupled to a source voltage supply terminal, and wherein each of the spare elements comprises:

at least one gate line traversing an active area formed on a semiconductor substrate;

a source line formed on one side of each of the at least one gate line, and comprising the cutoff part;

a drain line formed on the other side of each of the at least one gate line; and the cutoff part configured to electrically separate the source line and a source voltage supply terminal.

7. The semiconductor memory apparatus according to claim 6, wherein the change in the function of the main circuit component comprises at least one of an addition of a logic circuit, an adjustment of a delay time of a signal, and a change in a voltage level.

8. The semiconductor memory apparatus according to claim 6, wherein the main circuit component comprises:

an input/output (I/O) control unit configured to write data in the core circuit component or read data from the core circuit component; and a peripheral circuit component comprising a control circuit for exchanging data with the I/O control unit.

9. The semiconductor memory apparatus according to claim 6, wherein each of the plurality of spare elements comprises the cutoff part in the source voltage supply terminal.

10. The semiconductor memory apparatus according to claim 6, wherein a spare element comprises:

a first line provided with the cutoff part;

a second line; and a logic circuit component formed between the first line and the second line, wherein the first line is separated from the source voltage supply terminal by the cutoff part.

11. The semiconductor memory apparatus according to claim 6, wherein the cutoff part is provided between one side of the source line and the source voltage supply terminal.

12. A spare element comprising:

a first line provided with a cutoff part;

a second line; and a logic circuit component formed between the first line and the second line, wherein the first line is separated from a source voltage supply terminal by the cutoff part, the cutoff part of the spare element is electrically coupled to a source voltage supply terminal when the spare element is selected for changing a function of a main circuit component, and wherein each of the spare elements comprises:

at least one gate line traversing an active area formed on a semiconductor substrate;

the first line formed on one side of each of the at least one gate line, and comprising the cutoff part; and the second line formed on the other side of each of the at least one gate line.

* * * * *